United States Patent [19]

Nguyen et al.

[11] Patent Number: 4,651,267
[45] Date of Patent: Mar. 17, 1987

[54] PROPORTIONAL BASE DRIVE CIRCUIT FOR TRANSISTORIZED BRIDGE INVERTER

[75] Inventors: Vietson M. Nguyen; P. John Dhyanchand; Pierre S. Thollot, all of Rockford, Ill.

[73] Assignee: Sundstrand Corporation, Rockford, Ill.

[21] Appl. No.: 745,403

[22] Filed: Jun. 14, 1985

[51] Int. Cl.$^4$ .................. H02H 1/122; H02M 7/5387
[52] U.S. Cl. ...................................... 363/56; 363/132
[58] Field of Search ................. 363/17, 56, 80, 98, 363/131, 132; 323/289

[56] References Cited

U.S. PATENT DOCUMENTS

| 3,374,415 | 3/1968 | Jewett et al. ............................ 363/98 |
| 3,588,669 | 6/1971 | Wellford et al. |
| 3,999,086 | 12/1976 | Ekelund .............................. 323/289 |
| 4,319,316 | 3/1982 | Farrer et al. ........................... 363/41 |
| 4,424,556 | 1/1984 | Maeda et al. .......................... 363/17 |
| 4,493,017 | 1/1985 | Kammiller et al. ................. 363/132 |

FOREIGN PATENT DOCUMENTS

| 207877 | 12/1983 | Japan .................................. 363/131 |
| 2071950A | 9/1981 | United Kingdom . |
| 797033 | 1/1981 | U.S.S.R. ............................... 363/17 |
| 928557 | 5/1982 | U.S.S.R. ............................... 363/131 |

OTHER PUBLICATIONS

"A New Proportional Drive Technique for High Voltage Switching Transistors" by Ralph Carpenter of ELDEC Corporation, Lynwood, Washington—D-2, pp. 1-15, 1981.

Primary Examiner—William H. Beha, Jr.
Attorney, Agent, or Firm—Wood, Dalton, Phillips, Mason & Rowe

[57] ABSTRACT

A proportional base drive circuit which overcomes the problems of the prior art relative to relatively long turn-off time of power switches in an inverter and the absence of protection circuitry therefor includes a current transformer having a primary winding coupled to a main current electrode of a pair of power switches and first and second secondary windings each of which develops regenerative currents proportional to load current. First and second auxiliary switches are coupled between the secondary windings and the control electrodes of the power switches. Means are included for operating the auxiliary switches in synchronism with the power switches so that the power switches operate in rapid fashion. Means are also included for disabling the power switches when an overcurrent condition is sensed.

15 Claims, 6 Drawing Figures

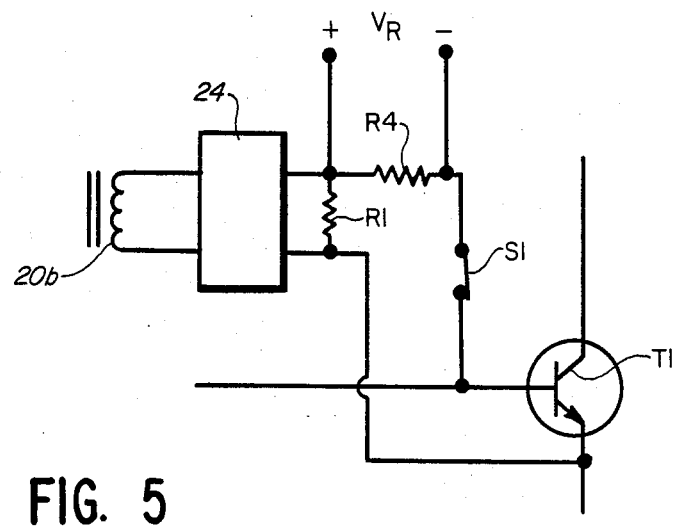
FIG. 5
FIG. 6
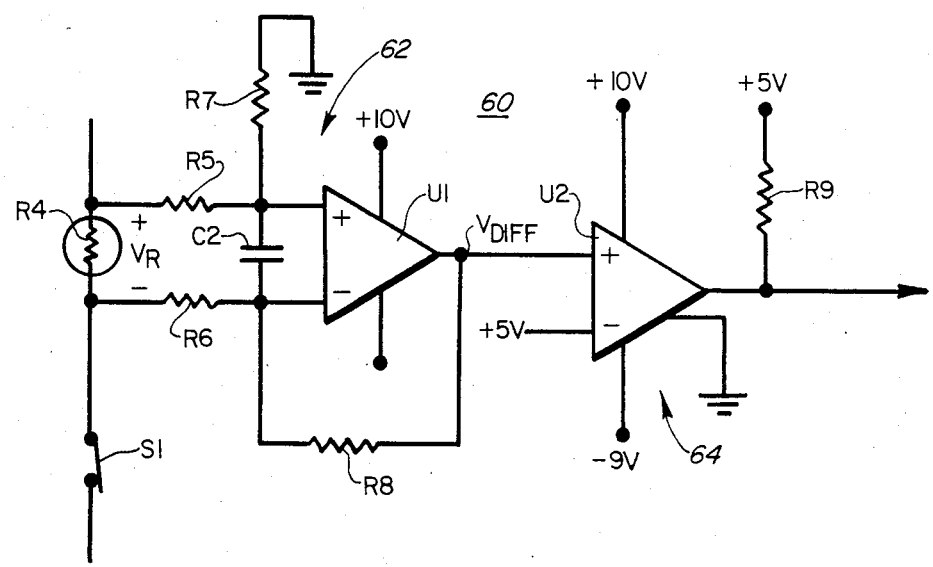

PROPORTIONAL BASE DRIVE CIRCUIT FOR TRANSISTORIZED BRIDGE INVERTER

DESCRIPTION

TECHNICAL FIELD

The present invention relates generally to switch control circuits, and more particularly to a proportional base drive circuit for a transistor.

BACKGROUND ART

Power transistors are often used in applications which require that they be operated as power switches, i.e. either fully saturated or off. Such an application may be, for example, an inverter wherein a pair of series-connected transistors are coupled across first and second voltages wherein the transistors are alternately operated to produce an alternating current and voltage at a junction therebetween for energizing a load. In such an application, it is critical that the switches, when on, be operated at an appropriate saturation level to minimize the turn on and turn off times and to minimize losses in the switches.

Proportional base drive circuits have been devised wherein the base current delivered to the transistor is controlled as a function of the current in the collector thereof. Such circuits utilize a current transformer having a primary winding connected in series with the collector of the transistor and a secondary winding coupled across the base-emitter junction of the transistor. An additional, or drive winding, is also provided on the current transformer core and is magnetically linked to the secondary winding. In operation, a drive pulse is developed in the drive winding by a base drive power supply which turns on the transistor via the secondary winding. This in turn causes current to flow in the collector and hence the primary winding. The current flow in the primary winding causes a voltage to be induced in the secondary winding which in turn develops a regenerative current that continues to operate the transistor in saturation even after the drive pulse is removed. The proportional base drive circuit thereby operates the transistor as a constant gain current amplifier. Such a proportional base drive circuit is disclosed in a paper entitled "A New Universal Proportional Drive Technique for a High Voltage Switching Transistor" by Ralph Carpenter of ELDEC Corporation, Lynwood, Wash., published in the Proceedings of Powercon 8, D-2 pp. 1-15, 1981.

However, it has been found that the core of the current transformer must be periodically "reset" to eliminate the deleterious effects arising from hysteresis of the core. This reset function is accomplished by the base drive power supply which develops a reset pulse of proper polarity in the drive winding. This necessity to reset the current transformer core unduly complicates the design of the base drive power supply because the timing of the reset pulse must be accurately controlled and the power supply must be capable of providing a pulse of significant amplitude.

The above type of design is also undesirable in those applications where two or more switches are to be controlled using a base drive proportional scheme. In this case, a primary winding must be connected in series with the collector of each transistor, in turn significantly increasing the size and weight of the circuit in which the transistors are used and increasing the number of separate conductors which are needed. This is particularly disadvantageous in those applications which utilize power switches colloquially termed "hockey puck" transistors wherein the main power electrodes of the device comprise upper and lower metal faces thereof with a separate connector provided for the base electrode so that two such transistors can be connected in series simply by pressing the appropriate faces together. In such an application, the extra conductors cause problems in packaging and introduces additional undesirable inductance into the output stage of the circuit.

An alternative type of proportional base drive circuit is disclosed in Kammiller et al U.S. Pat. No. 4,493,017. This proportional base drive circuit includes a single transformer which includes a primary winding which receives base drive signals, first and second secondary windings coupled to the bases of first and second power transistors, respectively, and a regenerative winding coupled in series between a load and the junction between the first and second power transistors. The application of a pulse to the primary winding causes the first power transistor to conduct, in turn causing load current to flow through the regenerative winding to the load. The current flowing through the regenerative winding causes a regenerative current to flow in the first secondary winding to maintain the first power transistor in a staturated state. Subsequently, the second drive transistor is turned on and the first transistor turned off by application of a pulse of opposite polarity to the primary winding, which in turn causes a load current of opposite direction to flow in the regenerative winding. This current induces a voltage and current in the second secondary winding to maintain the second transistor in the saturated state.

Similar types of proportional base drive circuits are disclosed in Maeda et al. U.S. Pat. No. 4,424,556, Farrer et al U.S. Pat. No. 4,319,316, Wellford U.S. Pat. No. 3,588,669 and Great Britain Patent Application No. 2 071 950 A. Further, the last-mentioned Great Britain patent application discloses such a base drive circuit in connection with a series-resonant inverter.

Such types of base drive proportional circuits, however, cannot be easily adapted for use with neutral point clamped inverters. Also, the turn off time of the power switches is not minimized. Nor is there any provision for protection circuitry to disable the switching devices in the event of an overload.

DISCLOSURE OF INVENTION

In accordance with the present invention, a proportional base drive circuit accomplishes a reduction in power switch turn off time thereby increasing efficiency. Furthermore, the base drive circuit is easily implemented in a neutral point clamped inverter and a protective function may be incorporated to disable the power switch in the event of an overcurrent or other abnormal condition.

According to the present invention, a proportional base drive circuit for alternately operating first and second power switches in an inverter or other power circuit includes a current transformer having a primary winding coupled to a main current electrode of each of the power switches so that the load current developed by both power switches flows through such winding and further including first and second secondary windings each of which develops regenerative currents proportional to the load current. First and second auxiliary switches are coupled between the first secondary winding and a control electrode of the first power switch and between the second secondary winding and the control electrode of the second power switch, respectively. Means are included for operating each of the first and second auxiliary switches in synchronism with the first and second power switches, respectively, whereby each auxiliary switch is closed when a base drive signal received by the respective power switch assumes a first level to thereby connect a secondary winding to the control electrode of such power switch and wherein each auxiliary switch is opened when the base drive signal assumes a second level to disconnect the secondary winding from the control electrode of the respective power switch.

In the preferred embodiment, each auxiliary switch has a response time which is an order of magnitude less than the associated power switch. Accordingly, therefore, the auxiliary switch can be opened quickly to remove the regenerative current from the control electrode of the associated power switch to thereby reduce the base current and hence permit faster turn off thereof.

According to a further embodiment of the invention, means are disposed in series with the regenerative winding for sensing an overcurrent condition and means responsive to the sensing means are provided for disabling the power switch when an overcurrent condition is sensed.

The proportional base drive circuit of the present invention may be utilized in a push-pull or PWM inverter, a resonant inverter or a neutral clamped PWM inverter.

BRIEF DESCRIPTION OF THE DRAWINGS

FIG. 5 is a schematic diagram of an alternative embodiment of the proportional base drive circuit of the present invention incorporating sensing means in the form of a resistor for sensing an overcurrent condition; and FIG. 6 is a schematic diagram of protective circuitry incorporating the sensing resistor shown in FIG. 5 for disabling a power switch in the event of an overcurrent condition.

BEST MODE FOR CARRYING OUT THE INVENTION

Figure 1:
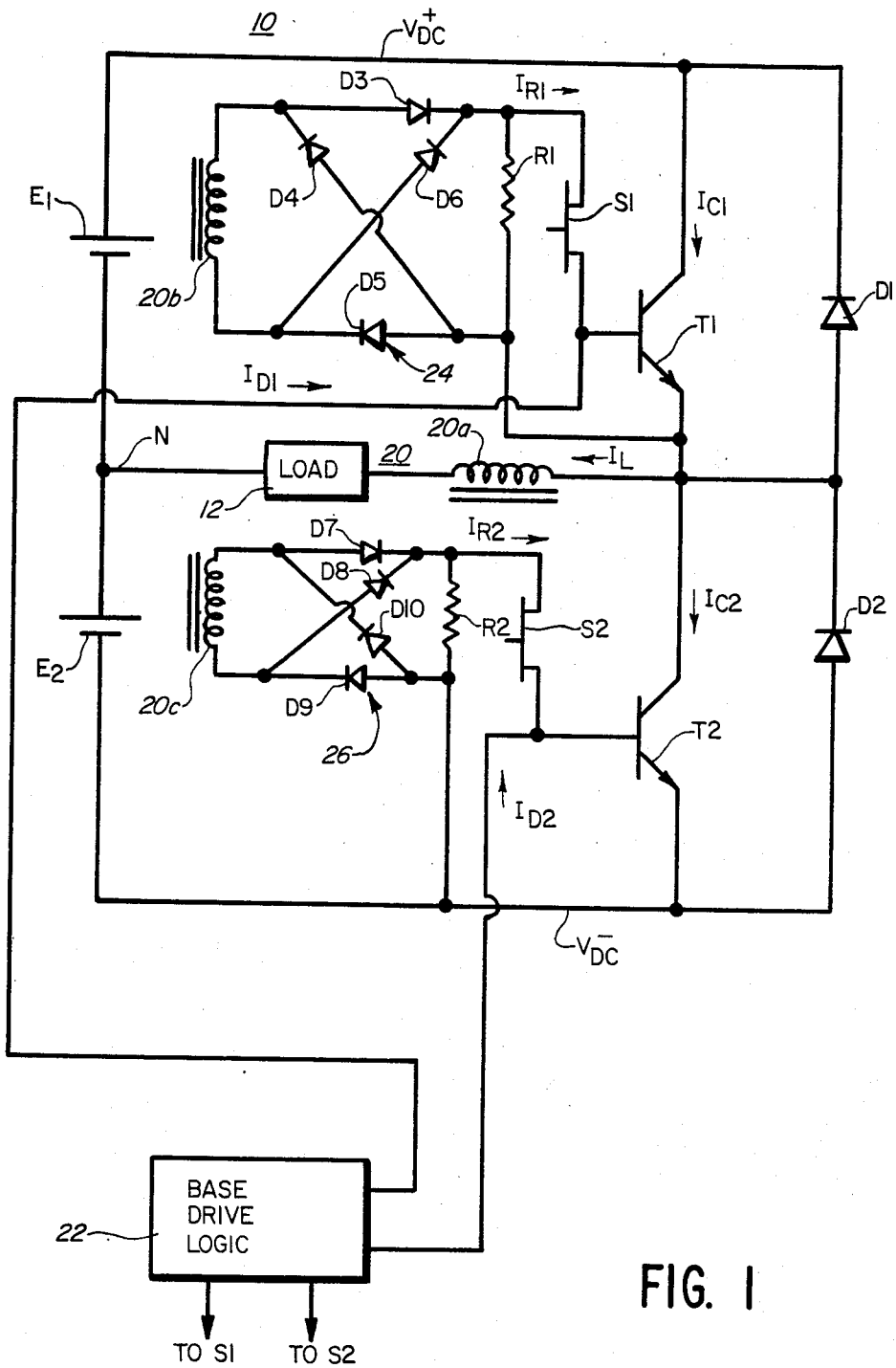
FIG. 1 is a combined schematic and block diagram of an inverter circuit incorporating the proportional base drive circuitry of the present invention.

Referring now to FIG. 1, there is illustrated an inverter 10 which develops an alternating current waveform for energizing a load 12. The inverter 10 receives first and second DC voltages $V_{DC}^+$ and $V_{DC}^-$ from a pair of DC voltage sources $E_1$ and $E_2$. The junction between the DC sources $E_1$, $E_2$ is a third or neutral voltage N intermediate the first and second DC voltages $V_{DC}^+$ and $V_{DC}^-$ and which is coupled to one end of the load 12.

Each of first and second power switches T1 and T2 includes two main current electrodes which are coupled in series across the voltages $V_{DC}^+$ and $V_{DC}^-$. A pair of free-wheeling diodes D1 and D2 are coupled in anti-parallel relationship with the transistors T1 and T2 to handle free-wheeling currents.

The junction between the transistors T1 and T2 is coupled through a primary winding 20a of a current transformer 20 to a second end of the load 12.

The switches T1 and T2 are illustrated as bipolar transistors, although it should be noted that they may comprise other types of power switches, as desired. These switches are triggered into conduction by a base drive logic circuit 22 coupled to the control or base electrodes of the switches. In the preferred embodiment, each power switch T1, T2 comprises a Darlington transistor which requires turn on and turn off pulses to drive each switch into conductive and nonconductive states, respectively. The turn on and turn off pulses are of opposite polarity and together comprise a base drive signal which assumes first and second levels, the first level being a positive potential relative to the emitter of the appropriate power transistor sufficient to gate the transistor into saturation and the second level being a negative potential sufficient to fully turn off the transistor.

The switches T1, T2 are operated alternately by the base drive logic 22 so that an alternating load current is developed. The load 12 and the winding 20a are both coupled to a main current electrode of both of the switches T1, T2 so that both half cycles of the load current flows therein. This alternating load current in turn induces a current to flow in first and second secondary windings 20b, 20c which are a part of the current transformer 20. These induced currents are proportional to the collector current of each power transistor and are rectified by rectifiers 24, 26 comprising diodes D3–D6, D7–D10 connected in a full wave bridge configuration to create a unidirectional regenerative current $I_{R1}$, $I_{R2}$, respectively.

Figure 2:
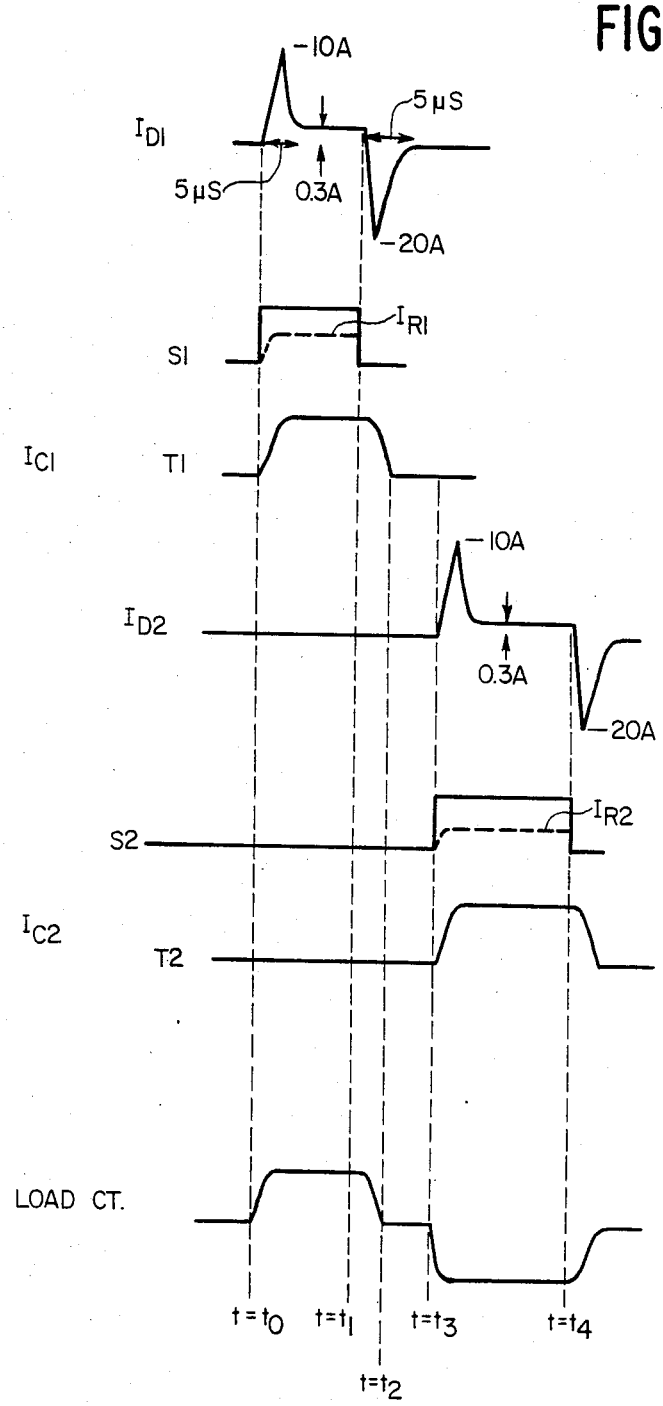
FIG. 2 is a series of waveform diagrams illustrating the operation of the circuitry shown in FIG. 1.

First and second auxiliary switches S1, S2 are coupled between the rectifier 24 and the control or base electrode of the transistor T1 and between the rectifier 26 and the control or base electrode of the transistor T2, respectively. In the preferred embodiment, the auxiliary switches comprise power MOSFET transistors. The switches S1, S2 are controlled by the base drive logic 22 in synchronism with the associated transistors T1, T2. More particularly, referring to the waveforms of FIG. 2, assume that at time $t=t_0$ a turn on pluse is developed by the base drive logic 22, as represented by the waveform $I_{D1}$. This pulse is coupled to the base of the transistor T1 and to the control electrode of the switch S1. In the preferred embodiment, the switch S1 has a response time an order of magnitude less than the response time of the associated switch T1. Therefore, the switch S1 turns on rapidly as compared with the turn on of the switch T1. The turn on pulse of the base drive signal $I_{D1}$ causes the collector current in the switch T1 to rise exponentially to a saturated level. This current flows through the winding 20a of the current transformer 20, and induces a current proportional to the load current in the secondary winding 20b which is rectified to produce a regenerative current $I_{R1}$, as noted by the dashed line superimposed on the waveform S1. This regenerative current $I_{R1}$ is applied through the closed switch S1 to the base of the transistor T1 so that the transistor T1 is maintained at an optimum level of saturation even after the magnitude of the turn on pulse is reduced to small value.

At time $t=t_1$, a turn off pulse is developed by the base drive logic 22 which is coupled to the base of the transistor T1. This negative pulse substantially immediately opens the switch S1, in turn removing the regenerative current from the base of the transistor T1. The negative base drive pulse then proceeds to sweep minority carriers out of the base emitter junction of the transistor T1 thereby turning off the transistor T1 at a time $t=t_2$ which follows the time $t_1$ by the sum of the storage and fall times of the transistor T1.

The removal of the regenerative current from the base or control electrode of the transistor T1 when the negative pulse is developed in the base drive signal permits rapid turn off of the transistor T1 by shortening the storage time thereof.

After a short delay period following the time $t=t_2$, a turn on pulse is developed at a time $t_3$ by the base drive logic circuit 22 which is coupled to the base of the transistor T2. The switch S2 substantially immediately closes to couple the now-developed regenerative current $I_{R2}$ to the base of the transistor T2 to maintain it at an optimum level of saturation. This regenerative current, illustrated by the dashed line superimposed on the waveform S2, continues to flow until a negative base drive pulse is developed at a time $t=t_4$, at which point the switch S2 opens and removes the regenerative base drive from the base of the transistor T2. The power switch T2 then turns off a short time later as determined by its storage and fall times.

It should be noted that a suitable base drive circuit which can be utilized as the drive logic 22 shown in FIG. 1 as disclosed in Upadhyay et al, copending application Ser. No. 705,663, filed Feb. 26, 1985, entitled "Inverter Shoot-Through Protection Circuit", assigned to the assignee of the instant application. Alternatively, the base drive circuit may comprise the circuit disclosed in Glennon, copending application Ser. No. 687,204, filed Dec. 28, 1984, entitled "Transistor Inverter Interlock Circuit", assigned to the assignee of the instant application.

In the preferred embodiment, a burden resistor $R_1$, $R_2$ is coupled across the rectifiers 24, 26, respectively, and the windings 20b, 20c, respectively, so that when both transistors T1 and T2 are off, a path is established to dissipate the high voltages developed by these secondary windings.

Since the current transformer primary winding 20a is connected between the load and the junction between the switches T1 and T2, bi-directional current flows in the primary winding 20a which in turn obviates the necessity to reset the core of the transformer 20. This results in a reduced power demand on the base drive logic circuit 22 and reduces the complexity thereof since there is no need for timing circuits to control the reset function.

Figure 3:
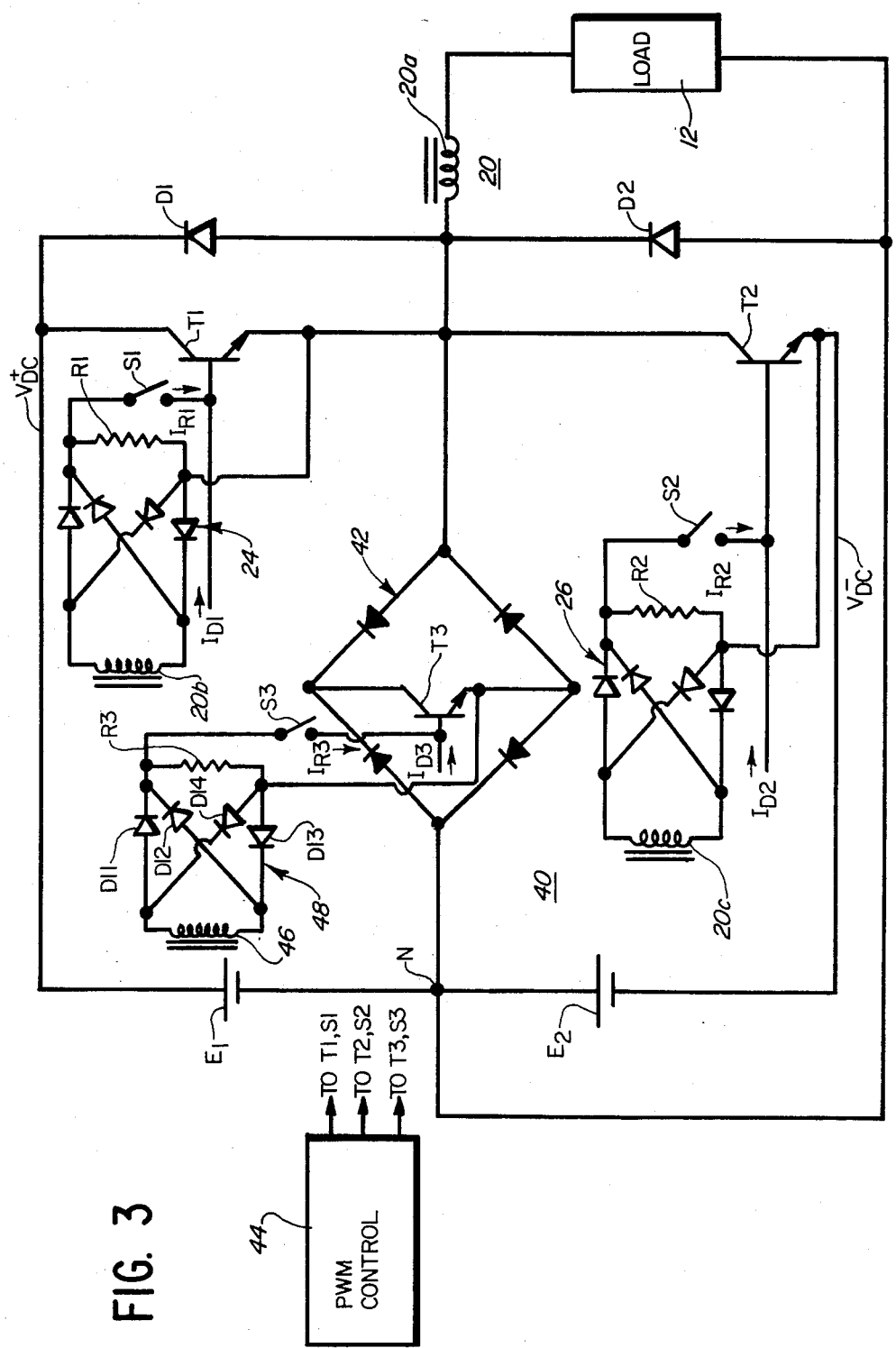
FIG. 3 is a combined schematic and block diagram of a neutral clamped inverter incorporating the proportional base drive circuitry of the present invention.

Referring now to FIG. 3, there is illustrated a further type of inverter 40 with which the proportional base drive circuits of the present invention may be used. The inverter 40 comprises a neutral-clamped pulse width modualted or PWM inverter. Elements shown in FIG. 3 which are identical to those shown in FIG. 1 are indicated by like reference numerals.

The inverter shown in FIG. 3 differs from that shown in FIG. 1 primarily in that a bi-directional switch 42 is coupled between the junction between the switches T1, T2 and the neutral voltage N. The bi-directional switch 42 is described with greater particularity in Shekhawat et al, application Ser. No. 672,305, filed Nov. 16, 1984, entitled "Control for a Neutral Point Clamped PWM Inverter".

Briefly, the switches T1-T3 are controlled so that during the first 180° of the output waveform developed at the junction between the switches T1 and T2, the switches T1 and T3 are operated in inverse relationship, i.e. when the switch T1 is on, the switch T3 is off, and vice versa. During this first 180°, the switches T1 and T3 are operated in a pulse width modulated mode by a pulse width modulated (PWM) control 44. During a second 180° of the output waveform, the PWM control 44 operates the switches T2 and T3 in inverse relationship in the PWM mode to create a pulse width modulated output for this portion of the waveform.

The switches S1 and S2 as well as a switch S3 connected between the base or control electrode of the switch T3 and a third secondary winding 46 of the current transformer 20 are operated in synchronism with the switches T1-T3, respectively. That is, the switch S1 is on when the switch T1 is on and is off when the switch T1 is off. Similarly, the switches S2 and S3 are on when the switches T2 and T3 are on, respectively, and are off when the switches T2 and T3 are off. As was noted in connection with the previous embodiment, the switches S1-S3 are selected to have a response time an order of magnitude less than the response time of the switches T1-T3. This ensures that the regenerative base currents are quickly removed from the base or control electrodes of the switches T1-T3 so that turn off can be effected as rapidly as possible. Also, as was noted in connection with the previous embodiment, the core of the current transformer 20 need not be reset since the primary winding 20a is connected in series with the load 12 and hence receives bi-directional current.

Figure 4:
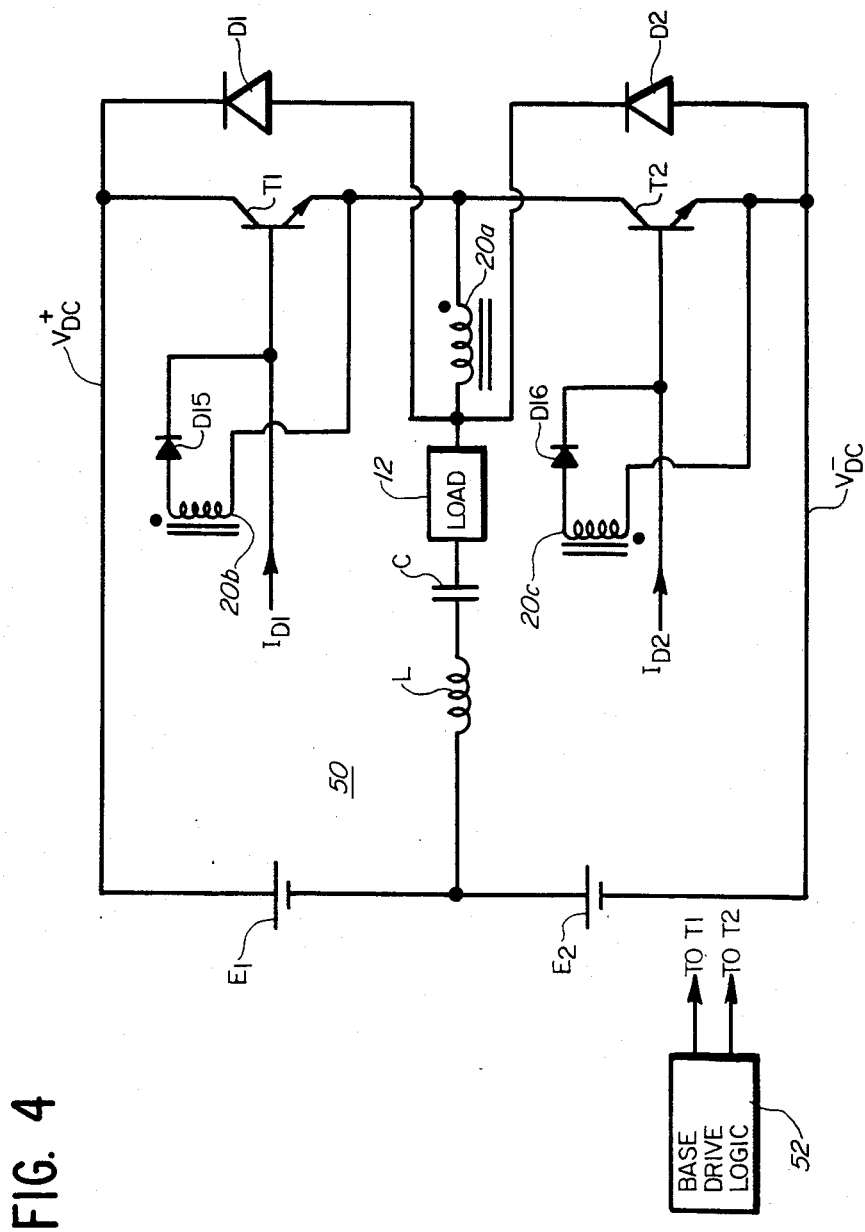
FIG. 4 is a combined schematic and block diagram of a series-resonant inverter incorporating the proportional base drive circuitry of the present invention.

Referring now to FIG. 4, there is illustrated a further type of inverter 50 commonly known as a resonant inverter. Again, elements in common with those illustrated in FIG. 1 are assigned like reference numerals.

The resonant inverter 50 includes a resonant output circuit comprising an inductor L and capacitor C which are connected in series with the load 12 and the primary winding 20a of the current transformer 20. The switches T1 and T2 are operated by a base drive logic 52 at or near the resonant frequency of the resonant circuit comprising the inductor L and capacitor C. In the illustrated embodiment, the base drive logic circuit 52 operates the switches T1 and T2 at a frequency slightly less than or equal to the resonant frequency. In this case, the switches S1 and S2 are not needed, instead, diodes D15 and D16 are coupled in series between the windings 20b, 20c and the base or control electrodes of the switches T1, T2, respectively. The switches S1, S2 are not needed in this case due to the polarity of the windings 20a–20c, as indicated by the dots in the figure, which ensures that the regenerative currents delivered through the diodes D15 and D16 flow at the appropriate times into the bases of the transistors T1, T2.

This type of operation at or below resonant frequency is sometimes referred to as "zero current turn off" operation, since the switches T1, T2 are turned off when the current therethrough is zero.

When it is desired to operate the switches T1, T2 above resonant frequency, the switches T1, T2 are turned off when the current therethrough is not zero. In this case, the diodes D15, D16 are replaced by the switches S1, S2 which are operated as described in connection with FIG. 1 to produce the desired resonant operation.

As was noted in connection with the previous embodiments, a resistor may be coupled across the base and emitter electrodes of each of the switches T1, T2 to provide a path for currents in the secondary windings when both of these switches are off.

It should be noted that diodes D1, D2 are coupled to the junction between the load 12 and the primary winding 20a. This prevents regenerative currents from flowing through the winding 20a which may adversely effect the operation of the transistors T1, T2.

Referring now to FIG. 5, there is illustrated a modification of the proportional base drive circuit of the present invention. Illustrated in FIG. 5 is a portion of the circuit shown in FIG. 1 including the switch T1, secondary winding 20b, rectifier 24, resistor R1 and switch S1. In addition, current sensing means in the form of a resistor R4 is connected in series with the switch S1 so that a voltage $V_R$ is developed thereacross proportional to the regenerative current $I_R$. Referring also to FIG. 6, the resistor R4 is coupled to an overcurrent protection circuit 60 which includes a differential amplifier 62 and a comparator 64. The overcurrent protection circuit 60 develops an overcurrent shutdown signal which disables the inverter switches when an abnormally high load current is generated.

When the switch S1 is closed, the voltage $V_R$ is developed across the resistor R4 which, as previously noted, is proportional to the regenerative current $I_R$. Since this regenerative current is in turn proportional to the collector or load current of the inverter, the voltage across the resistor R4 may be used to detect an overcurrent condition. The signal across the resistor R4 is coupled through a pair of resistors R5, R6 to noninverting and inverting inputs, respectively, of an operational amplifier U1. The operational amplifier U1, in conjunction with resistors R7, R8 and a capacitor C2 operates as a differential amplifier to develop a voltage $V_{DIFF}$ which is coupled to a noninverting input of a second operational amplifier U2. The amplifier U2 compares the signal $V_{DIFF}$ with a predetermined voltage, such as five volts, and develops the overcurrent shutdown signal based upon such comparison.

The output of the operational amplifier U2 is in turn coupled to the drive logic circuit 22 shown in FIG. 1 which disables all of the switches S1, S2, T1, T2 in the event of an overcurrent condition.

It should be noted that any of the inverters illustrated in the figures may incorporate this overcurrent shutdown circuitry, if desired.

The protection circuitry is particulary advantageous when used with the instant base drive circuitry since there is no need to isolate the protection circuitry from the base drive circuitry, as is the case in previous inverters in which current sensing is accomplished by directly sensing the load current. Furthermore, this current sensing does not rely upon the use of circuits which introduce losses in the output power, such as sensing resistors coupled in series with the load or other such devices.

We claim:

1. A proportional base drive circuit for controlling alternately operated first and second series-connected power switches in an inverter connected across first and second voltages, each switch including two main current electrodes and a control electrode which receives a base drive signal that assumes first and second levels for controlling the conduction of load current through the main current electrodes in respective half-cycles thereof, comprising:

a current transformer having a primary winding coupled to a main current electrode of both of the power switches so that both half-cycles of the load current flows through such winding and first and second secondary windings each of which develops regenerative currents proportional to the load current;

first and second auxiliary switches coupled between the first secondary winding and the control electrode of the first power switch and between the second secondary winding and the control electrode of the second power switch, respectively;

means for operating each of the first and second auxiliary switches in synchronism with the first and second power switches, respectively, whereby each auxiliary switch is closed when the drive signal received by the respective power switch assumes the first level to thereby connect a secondary winding to the control electrode of the such power switch and wherein each auxiliary switch is opened when the drive signal assumes the second level to disconnect the secondary winding from the control electrode of the respective power switch;

wherein the inverter is of the resonant type having a resonant output circuit, the switches are operated at a frequency greater than the resonant frequency of the output circuit, the resonant circuit and the primary winding are connected in series between a third voltage intermediate the first and second voltages and the junction between the first and second power switches and first and second diodes are connected in series between the first voltage and the second voltage, the junction between the diodes being connected to the junction between the resonant circuit and the primary winding.

2. A proportional base drive circuit for controlling alternately operated first and second series-connected power switches in an inverter connected across first and second voltages, each switch including two main current electrodes and a control electrode which receives a base drive signal which assumes first and second levels for controlling the conduction of load current through the main current electrodes in respective half-cycles thereof, comprising:

a current transformer having a primary winding coupled to a main current electrode of both of the power switches so that both half-cycles of the load current flows through such winding and first and second secondary windings each of which develops regenerative currents proportional to the load current;

first and second auxiliary switches coupled between the first secondary winding and the control electrode of the first power switch and between the second secondary winding and the control electrode of the second power switch, respectively;

means for operating each of the first and second auxiliary switches in synchronism with the first and second power switches, respectively, whereby each auxiliary switch is closed when the drive signal received by the respective power switch assumes the first level to thereby connect a secondary winding to the control electrode of the such power switch and wherein each auxiliary switch is opened when the drive signal assumes the second level to disconnect the secondary winding from the control electrode of the respective power switch;

a third power switch having two main current electrodes and a control electrode, the main current electrodes being coupled between the primary winding and a third voltage intermediate the first and second voltages;

the current transformer including a third secondary winding which develops a regenerative current proportional to the load current;

a third auxiliary switch coupled between the third secondary winding and the control electrode of the third power switch; and means for controlling the third power switch in synchronism with the third auxiliary switch and in inverse relationship with respect to the first and second power switches so that the voltage across the load only changes between the first and third voltages or between the second and third voltages.

3. A proportional base drive circuit for controlling alternately operated first and second series-connected power switches in an inverter connected across first and second voltages, each switch including two main current electrodes and a control electrode which receives a base drive signal which assumes first and second levels for controlling the conduction of load current through the main current electrodes in respective half-cycles thereof, comprising:

a current transformer having a primary winding coupled to a main current electrode of both of the power switches so that both half-cycles of the load current flows through such winding and first and second secondary windings each of which develops regenerative currents proportional to the load current;

first and second auxiliary switches coupled between the first secondary winding and the control electrode of the first power switch and between the second secondary winding and the control electrode of the second power switch, respectively;

means for operating each of the first and second auxiliary switches in synchronism with the first and second power switches, respectively, whereby each auxiliary switch is closed when the drive signal received by the respective power switch assumes the first level to thereby connect a secondary winding to the control electrode of the such power switch and wherein each auxiliary switch is opened when the drive signal assumes the second level to disconnect the secondary winding from the control electrode of the respective power switch;

means coupled to a secondary winding for sensing the magnitude of the regenerative current; and means responsive to the sensing means for disabling the inverter when the magnitude of the regenerative current exceeds a predetermined level.

4. The proportional base drive circuit of claim 3, wherein the sensing means comprises a resistor connected in series with the auxiliary switch and the secondary winding.

5. A proportional base drive circuit for controlling first and second power transistors in a resonant inverter having a resonant output circuit, the power transistors being connected in series across first and second voltages and being alternately operated to produce load current, each power transistor having a base electrode which receives a base drive signal which includes alternating positive and negative pulses to control the conduction of the power transistor and collector and emitter electrodes which conduct the load current, comprising:

a current transformer including a primary winding having a first end coupled to the emitter of the first power transistor and a second end coupled to a load, the current transformer also including a first secondary winding and a second secondary winding, each secondary winding developing a current proportional to the load current;

first and second rectifiers coupled to the first and second secondary windings, rspectively, for rectifying the currents developed therein to develop regenerative currents;

first and second auxiliary switches coupled between the first and second rectifiers and the base electrodes of the first and second power transistors, respectively;

means for operating the first and second auxiliary switches in synchronism with the first and second power transistors whereby a positive pulse of a base drive signal turns on one of the auxiliary switches and the power switch coupled thereto so that a regenerative current is coupled to the base electrode of such power switch until a negative pulse of the base drive signal turns off the auxiliary switch and removes the regenerative current from the base electrode to permit rapid turn off of such power switch;

wherein the switches are operated at a frequency greater than the resonant frequency of the output circuit, the resonant circuit and the primary winding are connected in series between a third voltage intermediate the first and second voltages and the junction between the first and second power switches and first and second diodes are connected in series between the first voltage and the second voltage, the junction between the diodes being connected to the junction between the resonant circuit and the primary winding.

6. A proportional base drive circuit for controlling first and second power transistors in an inverter, the power transistors being connected in series across first and second voltages and being alternately operated to produce load current, each power transistor having a base electrode which receives a base drive signal that includes alternating positive and negative pulses to control the conduction of the power transistor and collector and emitter electrodes which conduct the load current, comprising:

a current transformer including a primary winding having a first end coupled to the emitter of the first power transistor and a second end coupled to a load, the current transformer also including a first secondary winding and a second secondary winding, each secondary winding developing a current proportional to the load current;

first and second rectifiers coupled to the first and second secondary windings, respectively, for rectifying the currents developed therein to develop regenerative currents;

first and second auxiliary switches coupled between the first and second rectifiers and the base electrodes of the first and second power transistors, respectively;

means for operating the first and second auxiliary switches in synchronism with the first and second power transistors whereby a positive pulse of a base drive signal turns on one of the auxiliary switches and the power switch coupled thereto so that a regenerative current is coupled to the base electrode of such power switch until a negative pulse of the base drive signal turns off the auxiliary switch and removes the regenerative current from the base electrode to permit rapid turn off of such power switch;

means coupled to a secondary winding for sensing the magnitude of the regenerative current; and means responsive to the sensing means for disabling the power transistors and the auxiliary switches when the magnitude of the regenerative current exceeds a predetermined level.

7. The proportional base drive circuit of claim 6, wherein the sensing means comprises a resistor connected in series with the auxiliary switch and the secondary winding.

8. A proportional base drive circuit for controlling first and second power transistors in an inverter, the power transistors being connected in series across first and second voltages and being alternately operated to produce load current, each power transistor having a base electrode which receives a base drive signal which includes alternating positive and negative pulses to control the conduction of the power transistor and collector and emitter electrodes which conduct the load current, comprising:

a current transformer having a primary winding having a first end coupled to the emitter of the first power transistor and the collector of the second power transistor and a second end coupled to a load, the current transformer also having a first secondary winding and a second secondary winding, each secondary winding developing a current proportional to the load current;

first and second auxiliary switches coupled between the first and second secondary windings and the base electrodes of the first and second power transistors, respectively;

means for operating the first and second auxiliary switches in synchronism with the first and second power transistors whereby each power transistor, when conductive, receives a base current proportional to the collector current;

means for sensing the magnitude of the regenerative current developed by each secondary winding; and means for disabling the power transistors and the auxiliary switches when the magnitude of a regenerative current exceeds a predetermined level.

9. The proportional base drive circuit of claim 8, wherein the sensing means comprises a resistor coupled in series between a secondary winding and a base electrode of one of the power transistors.

10. The proportional base drive circuit of claim 8, wherein the disabling means includes a differential amplifier coupled to the sensing means and a comparator coupled to the differential amplifier for developing an overcurrent shutdown signal when the voltage across the sensing means exceeds a predetermined level.

11. The proportional base drive circuit of claim 8, further including first and second rectifiers coupled between the first and second secondary windings and each sensing means, respectively.

12. The proportional base drive circuit of claim 11, wherein each rectifier comprises a full wave diode bridge.

13. The proportional base drive circuit of claim 8, wherein each power transistor comprises a bipolar transistor and wherein each auxiliary switch comprises a MOSFET.

14. The proportional base drive circuit of claim 8, wherein the auxiliary switches have a response time which is an order of magnitude less than the response time of the power transistors so that the regenerative currents are disconnected from the power transistors when a negative pulse is developed in the base drive signal and before turn off of such power transistor.

15. The proportional base drive circuit of claim 8, further including a burden resistor coupled across each secondary winding.

* * * * *